(12) United States Patent
Gong

(10) Patent No.: US 11,323,595 B2
(45) Date of Patent: May 3, 2022

(54) CHIP ASSEMBLY, CAMERA AND ELECTRONIC DEVICE

(71) Applicant: GUANGDONG OPPO MOBILE TELECOMMUNICATIONS CORP., LTD., Guangdong (CN)

(72) Inventor: Jianglong Gong, Guangdong (CN)

(73) Assignee: GUANGDONG OPPO MOBILE TELECOMMUNICATIONS CORP., LTD., Dongguan (CN)

(*) Notice: Subject to any disclaimer, the term of this patent is extended or adjusted under 35 U.S.C. 154(b) by 0 days.

(21) Appl. No.: 16/769,870

(22) PCT Filed: Nov. 19, 2018

(86) PCT No.: PCT/CN2018/116206
§ 371 (c)(1),
(2) Date: Jun. 4, 2020

(87) PCT Pub. No.: WO2019/120015
PCT Pub. Date: Jun. 27, 2019

(65) Prior Publication Data
US 2021/0185192 A1    Jun. 17, 2021

(30) Foreign Application Priority Data

Dec. 19, 2017 (CN) .......................... 201711377536.5
Dec. 19, 2017 (CN) .......................... 201721809499.6

(51) Int. Cl.
*H04N 5/225* (2006.01)
*H04N 5/247* (2006.01)

(52) U.S. Cl.
CPC ......... *H04N 5/2251* (2013.01); *H04N 5/2256* (2013.01); *H04N 5/2257* (2013.01); *H04N 5/247* (2013.01)

(58) Field of Classification Search
CPC .. H04N 5/2251; H04N 5/2257; H04N 5/2256; H04N 5/247
See application file for complete search history.

(56) References Cited

U.S. PATENT DOCUMENTS

2007/0040932 A1    2/2007  Chen
2013/0050571 A1*   2/2013  Tam .................. H01L 27/14683
                                              348/374

(Continued)

FOREIGN PATENT DOCUMENTS

CN    102376733 A    3/2012
CN    102496622 A    6/2012

(Continued)

OTHER PUBLICATIONS

English translation of ISR for PCT application PCTCN 2018116206 dated Feb. 12, 2019.

(Continued)

*Primary Examiner* — Mekonnen D Dagnew
(74) *Attorney, Agent, or Firm* — Young Basile Hanlon & MacFarlane, P.C.

(57) ABSTRACT

A chip assembly and a mold assembly for fabricating the same, a camera and an electronic device are disclosed. The chip assembly includes a circuit board, a chip and a conductive wire. The chip is provided to the circuit board, and the chip and the circuit board are in a stacked arrangement. One end of the conductive wire is electrically coupled to the circuit board, the other end of the conductive wire is electrically coupled to the chip, and a partial segment of the conductive wire is attached to a side wall face of the chip.

19 Claims, 4 Drawing Sheets

(56) References Cited

U.S. PATENT DOCUMENTS

2019/0148429 A1* 5/2019 Wang ................ H01L 27/14621
                                                                                348/294
2020/0243475 A1* 7/2020 Chen ....................... H01L 24/73

FOREIGN PATENT DOCUMENTS

| CN | 202307899 U | 7/2012 |
|----|-------------|--------|
| CN | 102957854 A | 3/2013 |
| CN | 205754556 U | 11/2016 |
| CN | 107888812 A | 4/2018 |
| CN | 107888815 A | 4/2018 |
| CN | 207543219 U | 6/2018 |
| JP | 2008124950 A | 5/2008 |

OTHER PUBLICATIONS

Extended European Search Report for EP Application 18891020.2 dated Feb. 2, 2021. (6 pages).
Indian Examination Report for IN Application 202017027751 dated May 25, 2021. (6 pages).

* cited by examiner

CHIP ASSEMBLY, CAMERA AND ELECTRONIC DEVICE

CROSS-REFERENCE TO RELATED APPLICATION(S)

The present application is a 371 application of International Application No. PCT/CN2018/116206, filed on Nov. 19, 2018, which claims priority to Chinese Patent Application Serial Nos. 201711377536.5, and 201721809499.6, both filed on Dec. 19, 2018, the disclosures of all of which are hereby incorporated by reference in their entireties.

TECHNICAL FIELD

The present disclosure relates to a technical field of electronic devices, and more particularly, to a chip assembly, a camera, and an electronic device.

BACKGROUND

As technologies associated with electronic devices develop, electronic devices have a tendency towards miniaturization. As an important part in an electronic device, the design size of the camera is a key technical point to reduce the thickness of the electronic device. In addition, due to external force, connecting wires between a chip and a circuit board in the camera are easy to break.

SUMMARY

A chip assembly for a camera according to embodiments of the present disclosure includes: a circuit board, a chip, and a conductive wire. The chip is provided to the circuit board and stacked with the circuit board. The conductive wire has a first end electrically coupled to the circuit board and a second end electrically coupled to the chip, a partial segment of the conductive wire is attached to a side wall face of the chip.

A camera according to embodiments of the present disclosure includes: a chip assembly configured as the above-mentioned chip assembly.

An electronic device according to embodiments of the present disclosure includes: a camera configured as the above-mentioned camera.

Additional aspects and advantages of embodiments of present disclosure will be given in part in the following descriptions, become apparent in part from the following descriptions, or be learned from the practice of the embodiments of the present disclosure.

BRIEF DESCRIPTION OF DRAWINGS

These and/or other aspects and advantages of embodiments of the present disclosure will become apparent and more readily appreciated from the following descriptions of embodiments made with reference to the drawings, in which.

DETAILED DESCRIPTION

Figure 1:
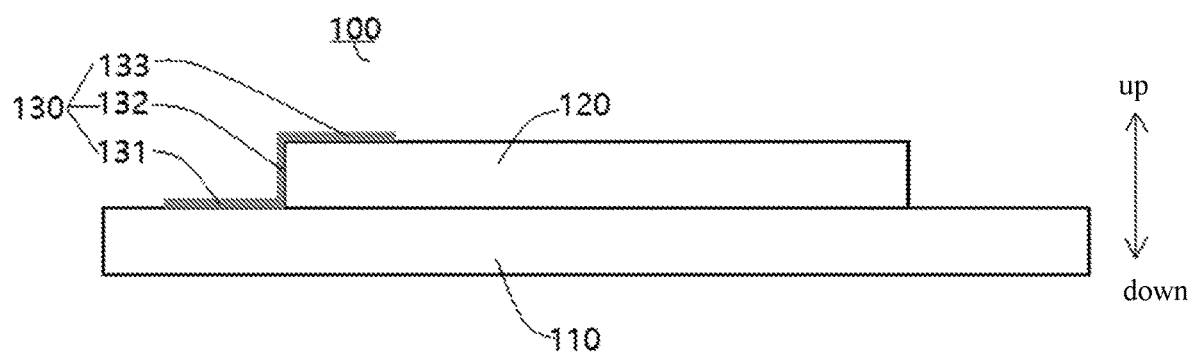
FIG. 1 illustrates a schematic view of a chip assembly for a camera according to an embodiment of the present disclosure.

Embodiments of the present disclosure will be described in detail below, and examples of the embodiments will be illustrated in the accompanying drawings. The same or similar reference numerals represent the same or similar elements or the elements having the same or similar functions throughout the descriptions. The embodiments described below with reference to the accompanying drawings are examples, are merely used to explain the present disclosure, and cannot be construed to limit the present disclosure.

In the description of the present disclosure, it should be understood that terms such as "central," "thickness," "up," "down," "left," "right," "inner," "outer" and the like should be construed to refer to the orientation as then described or as illustrated in the drawings under discussion. These terms are for convenience and simplification of description and do not indicate or imply that the device or element referred to must have a particular orientation, or be constructed and operated in a particular orientation, so these terms shall not be construed to limit the present disclosure. In addition, the feature defined with "first" and "second" may comprise one or more of this feature. In the description of the present disclosure, "a plurality of" means two or more than two, unless specified otherwise.

In the description of the present disclosure, it should be noted, unless specified or limited otherwise, the terms "mounted," "connected," "coupled" or the like are used broadly. The terms may be, for example, fixed connections, detachable connections, or integral connections; may also be mechanical or electrical connections, may also be direct connections or indirect connections via intervening structures; and may also be inner communications of two elements, which could be understood by those skilled in the art according to specific situations.

Figure 6:
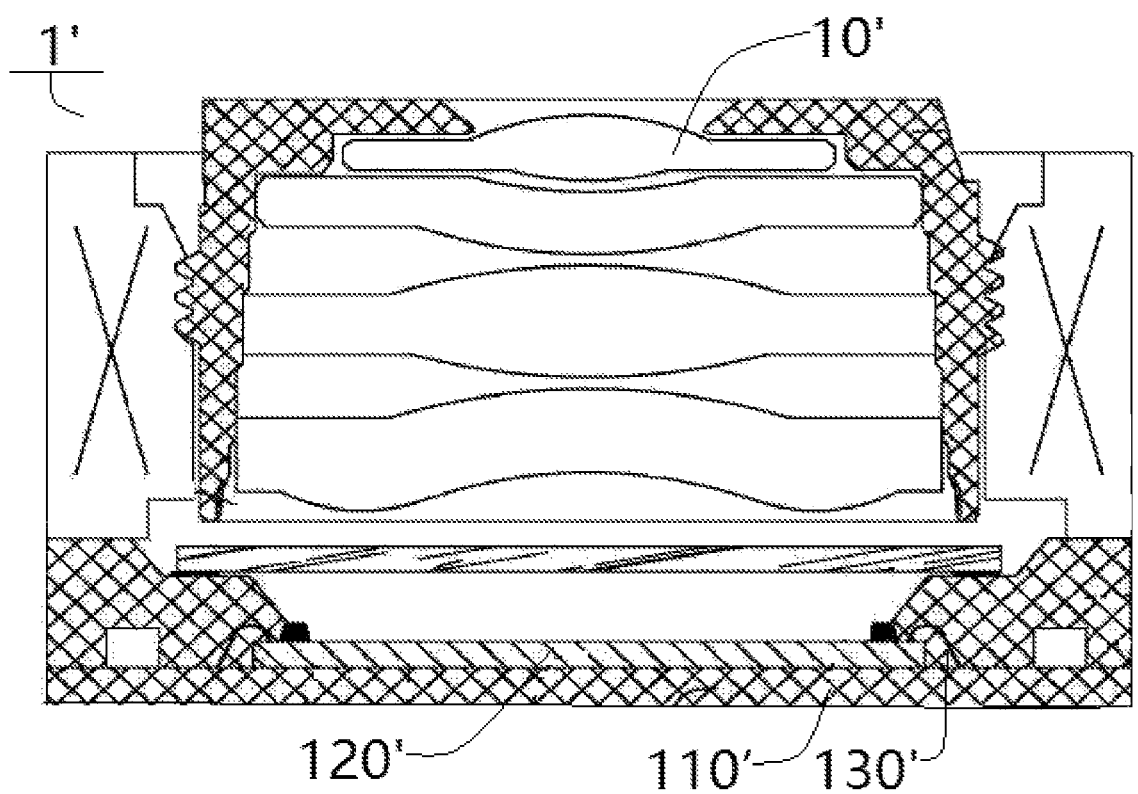
FIG. 6 illustrates a partial schematic view of an electronic device in the related art.

In the related art, generally, a conductive wire 130 is directly provided between a chip 120 and a circuit board 110 of a camera 1 to achieve connection, as illustrated in FIG. 6. This connection method usually encounters a situation that the conductive wire 130 is broken due to various reasons such as post-baking stress, process control, and reliability experiments. Moreover, since the conductive wire 130 has a certain curvature, the thickness of the electronic device 1 is increased.

Figure 2:
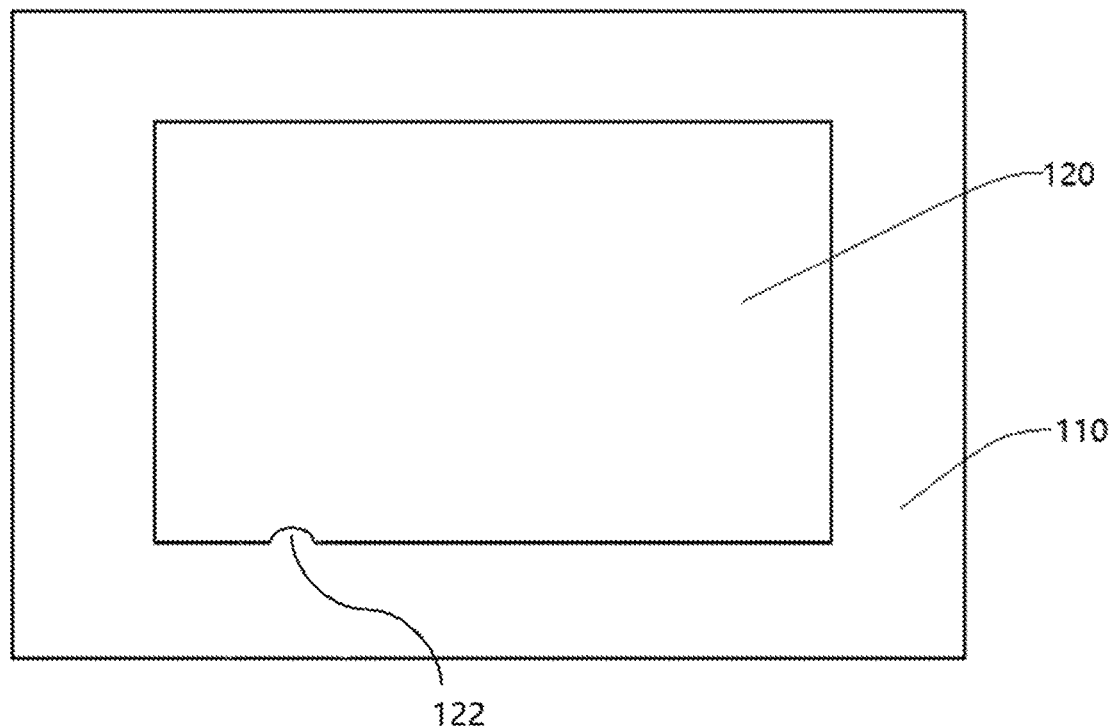
FIG. 2 illustrates a schematic view of a chip assembly for a camera according to an embodiment of the present disclosure.
Figure 3:
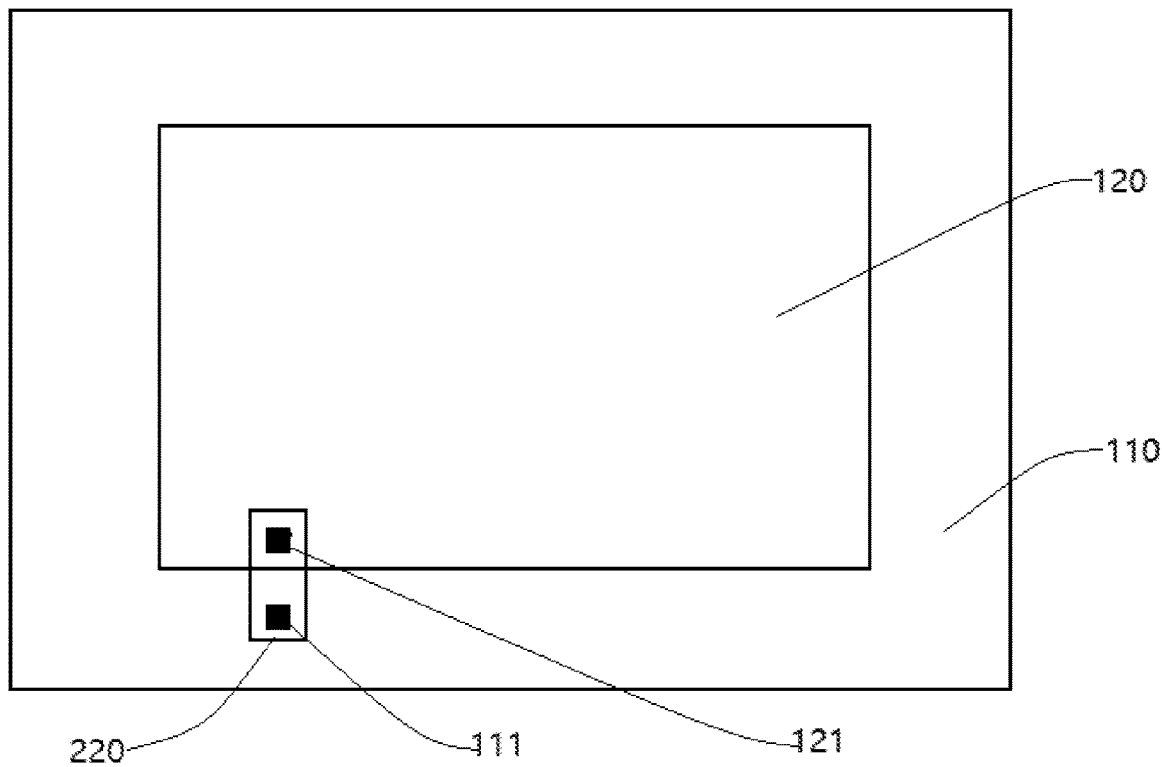
FIG. 3 illustrates a schematic view of a chip assembly for a camera according to an embodiment of the present disclosure.

As illustrated in FIGS. 1-3, a chip assembly 100 for a camera 10 according to embodiments of the present disclosure includes a circuit board 110, a chip 120, and a conductive wire 130.

In some embodiments, as illustrated in FIGS. 1-3, the chip 120 is disposed to the circuit board 110, and the chip 120 and the circuit board 110 are stacked. One end of the conductive wire 130 is electrically coupled to the circuit board 110, while the other end of the conductive wire 130 is electrically coupled to the chip 120, and a partial segment of the conductive wire 130 is attached to a side wall face of the chip 120. It could be understood that the chip 120 at least partially overlaps with the circuit board 110, the chip 120 may be located on the circuit board 110, and the circuit board 110 may support the chip 120. Both ends of the conductive wire 130 may be electrically coupled to the chip 120 and the circuit board 110 respectively, thereby achieving indirect electrical connection between the chip 120 and the circuit board 110. A part of the conductive wire 130 may be attached to the side wall face of the chip 120.

For the chip assembly 100 for the camera 10 according to the embodiments of the present disclosure, by attaching a part of the conductive wire 130 to the side wall face of the chip 120, the fixation of the conductive wire 130 can be facilitated, and the installation stability of the conductive wire 130 can be improved, thereby avoiding a situation that the conductive wire 130 is broken due to various reasons such as post-baking stress, process control, and reliability experiments. In addition, the length of the conductive wire 130 can also be shortened to prevent the conductive wire 130 from forming an arc shape and increasing the thickness of the chip assembly 100, to reduce the design size of the chip assembly 100 and facilitate the miniaturization design of the camera 10.

According to some embodiments of the present disclosure, as illustrated in FIG. 2, the side wall face of the chip 120 may have a groove 122, and the conductive wire 130 may be embedded in the groove 122. It could be understood that the side wall face of the chip 120 may be provided with the groove 122, the groove 122 may penetrate the chip 120 in a thickness direction of the chip 120, and the conductive wire 130 may be disposed in the groove 122. Therefore, the conductive wire 130 can be positioned in the groove 122 to prevent the conductive wire 130 from being shifted due to external force, which would cause the conductive wire 130 to be broken or to be disconnected with the chip 120 or the circuit board 110. The groove 122 can also block part of the external force and prevent the conductive wire 130 from being broken under the external force, to protect the conductive wire 130.

For example, as illustrated in FIG. 3, the circuit board 110 may be provided with a first welding point 111 thereon, and the chip 120 may be provided with a second welding point 121 thereon. The second welding point 121 may be located in a position on the chip 120 close to the first welding point 111, and the first welding point 111 may be located in a position on the circuit board 110 close to the second welding point 121. A groove 122 may be provided in a side wall face of the chip 120 close to the second welding point 121. The groove 122 may be formed as a semi-cylindrical groove, and an axis direction of the semi-cylindrical groove is consistent with the thickness direction of the chip 120. A middle segment of the conductive wire 130 can be placed in the groove 122.

According to some embodiments of the present disclosure, the conductive wire 130 may be an injection-molded part, and the conductive wire 130 is formed on the side wall face of the chip 120. In other words, the conductive wire 130 may be formed on the side wall face of the chip 120 by injection molding. As a result, the conductive wire 130 and the chip 120 can be formed as a whole, and the position of the conductive wire 130 is fixed, the installation of the conductive wire 130 is more stable, and the conductive wire 130 will not be deformed under the action of external force. For example, the conductive wire 130 can be formed by injection molding a liquid conductive medium on the side wall face of the chip 120.

According to some embodiments of the present disclosure, the conductive wire 130 may be a printed circuit. It could be understood that the conductive wire 130 may be etched on the side wall face of the chip 120 by a printing method or a photosensitive process, so that the conductive wire 130 can be quickly drawn directly on a glass plate by an automatic plotter for plate-making, and then be printed. The printed circuit can make the mass production of the chip assembly 100 simple and easy, and the printed conductive wires 130 can have consistent performance, stable quality, and compact structures. The printed circuit can omit the welding process, thereby improving the production efficiency of the chip assembly 100. Moreover, the printed circuit can achieve high precision, thereby greatly enhancing the production efficiency, stability, and profitability of the circuit board 110.

According to some embodiments of the present disclosure, the conductive wire 130 may be a gold wire. It could be understood that the conductive wire 130 can be made of gold. Gold has excellent ductility, good stability, small resistivity and good electrical conductivity, and is not easy to generate heat.

As illustrated in FIG. 1, according to some embodiments of the present disclosure, the conductive wire 130 may include a first segment 131 and a second segment 132, wherein the first segment 131 is attached to an upper surface of the circuit board 110, a lower end of the second segment 132 is coupled to the first segment 131, and the second segment 132 is attached to the side wall face of the chip 120. It could be understood that the conductive wire 130 may include the first segment 131 and the second segment 132, one end of the first segment 131 is electrically coupled to the circuit board 110, and the other end of the first segment 131 is electrically coupled to one end of the second segment 132; the first segment 131 may be attached to a side surface of the circuit board 110 close to the chip 120, and the second segment 132 may be attached to the side wall face of the chip 120. Thus, the installation stability of the conductive wire 130 can be enhanced.

Further, as illustrated in FIG. 1, the conductive wire 130 may further include a third segment 133, the third segment 133 is coupled to an upper end of the second segment 132, and the third segment 133 is attached to an upper surface of the chip 120. As a result, the conductive wire 130 can be arranged in contact with surfaces of the chip 120 and the circuit board 110, thereby preventing the conductive wire 130 from being in a suspended state, to reduce the probability of breakage of the conductive wire 130 and enhance the installation stability of the conductive wire 130.

For example, as illustrated in FIGS. 1-3, the chip 120 may be placed on the upper surface of the circuit board 110 (as illustrated in FIG. 1), and the chip 120 may be located at a middle position of the circuit board 110. The conductive wire 130 may include the first segment 131, the second segment 132, and the third segment 133. The second welding point 121 may be provided on the upper surface of the chip 120 (as illustrated in FIG. 1), and the first welding point 111 may be provided on the upper surface of the circuit board 110 (as illustrated in FIG. 1). One end of the first segment 131 may be electrically coupled to the first welding point 111, while the other end of the first segment 131 may be electrically coupled to one end of the second segment 132; the other end of the second segment 132 may be coupled to one end of the third segment 133; the other end of the third segment 133 may be electrically coupled to the second welding point 121. The first segment 131 can be attached to the upper surface of the circuit board 110 (as illustrated in FIG. 1), the second segment 132 can be attached to the side wall face of the chip 120, and the third segment 133 can be attached to the upper surface of the chip 120 (as illustrated in FIG. 1).

The camera 10 according to embodiments of the present disclosure includes a chip assembly, and the chip assembly is the chip assembly 100 as described above.

For the camera 10 according to the embodiments of the present disclosure, by attaching a part of the conductive wire 130 to the side wall face of the chip 120, the fixation of the conductive wire 130 can be facilitated, and the installation stability of the conductive wire 130 can be improved. In addition, it is possible to avoid the situation that the conductive wire 130 is broken due to various reasons such as post-baking stress, process control, and reliability experiments. Moreover, the length of the conductive wire 130 can also be shortened to prevent the conductive wire 130 from forming an arc shape and increasing the thickness of the chip assembly 100, to reduce the design size of the chip assembly 100 and facilitate the miniaturization design of the camera 10.

An electronic device 1 according to embodiments of the present disclosure includes a camera, and the camera is the camera 10 described above. The camera 10 may be embedded in a housing 50 of the electronic device 1.

It should be noted that "the electronic device" herein includes, but is not limited to devices for receiving/transmitting a communication signal via a wired line connection (for example, via Public Switched Telephone Network (PSTN), Digital Subscriber Line (DSL), a digital cable, direct cable connection, and/or another data connection/network) and/or via a wireless interface (for example, cellular networks, wireless local area networks (WLANs), digital television networks (such as DVB-H networks), satellite networks, AM-FM broadcast transmitters, and/or another communication terminal). An electronic device configured to communicate via a wireless interface may be referred to as "a wireless electronic device," "a wireless device," and/or "a mobile electronic device." Examples of the mobile electronic device include, but are not limited to, satellite or cellular telephones; personal communication system (PCS) devices that may combine cellular radiotelephone with data processing, fax, and data communication capabilities; PDAs that may include radiotelephones, pagers, Internet/Intranet access, web browsers, memo pads, calendars, and/or global positioning system (GPS) receivers; and conventional laptop and/or palmtop receivers or other electronic devices including radiotelephone transceivers.

For the electronic device 1 according to the embodiments of the present disclosure, by attaching a part of the conductive wire 130 to the side wall face of the chip 120, the fixation of the conductive wire 130 can be facilitated, and the installation stability of the conductive wire 130 can be improved. In addition, it is possible to avoid the situation that the conductive wire 130 is broken due to various reasons such as post-baking stress, process control, and reliability experiments. Moreover, the length of the conductive wire 130 can also be shortened to prevent the conductive wire 130 from forming an arc shape and increasing the thickness of the chip assembly 100, to reduce the design size of the chip assembly 100 and facilitate the miniaturization design of the camera 10.

Further, the electronic device 1 may be provided with a plurality of cameras 10. The plurality of cameras 10 may be electrically coupled, and the plurality of cameras 10 can cooperate with each other for photographing, to improve an imaging effect. Furthermore, the electronic device 1 may further include a flash 60. The flash 60 may be embedded in the housing 50, and the flash 60 is close to the cameras 10.

Therefore, when the cameras 10 are working, the flash 60 can illuminate the subject, thereby improving the photographing effect.

Figure 4:
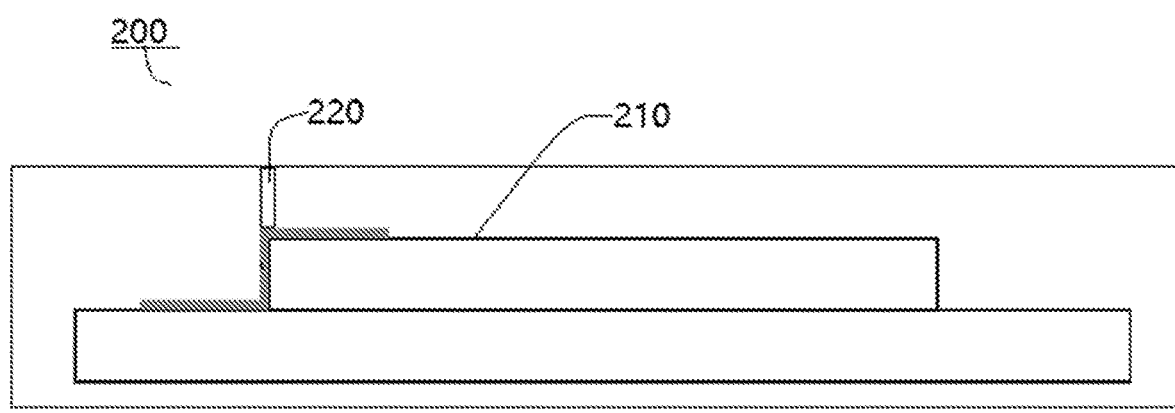
FIG. 4 illustrates a schematic view of a mold assembly for fabricating a chip assembly according to an embodiment of the present disclosure.
Figure 5:
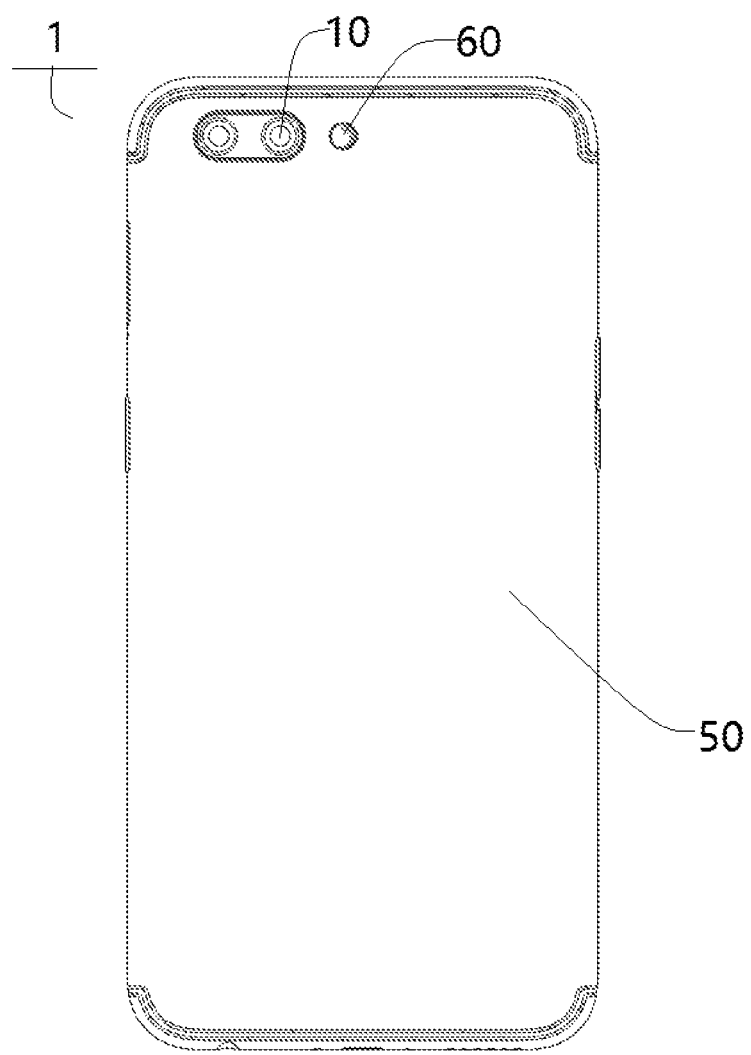
FIG. 5 illustrates a schematic view of an electronic device according to an embodiment of the present disclosure.

As illustrated in FIG. 4, in a mold assembly 200 for fabricating a chip assembly 100 according to embodiments of the present disclosure, the chip assembly 100 may include a chip 120, a circuit board 110, and a conductive wire 130. One end of the conductive wire 130 is coupled to the circuit board 110, while the other end of the conductive wire 130 is coupled to the chip 120. The mold assembly 200 has an injection cavity 210 and an injection hole 220, and the injection hole 220 is in communication with the injection cavity 210. The chip 120 and the circuit board 110 are located in the injection cavity 210, and the conductive wire 130 is formed by injection molding in the injection hole 220. A part of the conductive wire 130 is attached to a side wall face of the chip 120.

It could be understood that the injection cavity 210 may be formed inside the mold assembly 200, and the chip 120 and the circuit board 110 may be located in the injection cavity 210. The injection hole 220 may be provided through a mold, and one end of the injection hole 220 is in communication with the injection cavity 210 while the other end of the injection hole 220 penetrates the mold assembly 200. A conductive medium can be injected from the injection hole 220, so that the conductive wire 130 can be formed on the chip 120 and the circuit board 110. One end of the conductive wire 130 can be electrically coupled to the chip 120, while the other end of 130 can be electrically coupled to the circuit board 110. A part of the conductive wire 130 can be formed on the side wall face of the chip 120.

For the mold assembly 200 for fabricating the chip assembly 100 according to the embodiments of the present disclosure, by attaching a part of the conductive wire 130 to the side wall face of the chip 120, the fixation of the conductive wire 130 can be facilitated, and the installation stability of the conductive wire 130 can be improved. In addition, it is possible to avoid the situation that the conductive wire 130 is broken due to various reasons such as post-baking stress, process control, and reliability experiments. Moreover, the length of the conductive wire 130 can also be shortened to prevent the conductive wire 130 from forming an arc shape and increasing the thickness of the chip assembly 100, to reduce the design size of the chip assembly 100 and facilitate the miniaturization design of the camera 10.

The chip assembly 100 for the camera 10 according to the embodiments of the present disclosure will be described in detail below with reference to FIGS. 1-4.

As illustrated in FIGS. 1-3, the chip 120 may be formed in a rectangular shape, and the circuit board 110 may also be formed in a rectangular shape. The chip 120 may be stacked and arranged on the circuit board 110, the chip 120 may be located at a middle position of the circuit board 110, and the circuit board 110 may support the chip 120. The surface area of the chip 120 is smaller than the surface area of the circuit board 110. When the chip 120 is placed on the circuit board 110, an edge of the chip 120 may be spaced from an edge of the circuit board 110, and a part of an upper surface of the circuit board 110 (an "up" direction as illustrated in FIG. 1) is in contact with a lower surface of the chip 120 (a "down" direction as illustrated in FIG. 1).

As illustrated in FIGS. 1-3, the conductive wire 130 may include a first segment 131, a second segment 132, and a third segment 133. A second welding point 121 may be provided on an upper surface of the chip 120 (the "up" direction as illustrated in FIG. 1), and a first welding point 111 may be provided at a position on the upper surface of the circuit board 110 (the "up" direction as illustrated in FIG. 1), which is not in contact with the lower surface of the chip 120 (the "down" direction as illustrated in FIG. 1). One end of the first segment 131 may be electrically coupled to the first welding point 111, the other end of the first segment 131 may be electrically coupled to one end of the second segment 132, the other end of the second segment 132 may be coupled to one end of the third segment 133, and the other end of the third segment 133 is electrically coupled to the second welding point 121. The first segment 131 can be attached to the upper surface of the circuit board 110 (the "up" direction as illustrated in FIG. 1), the second segment 132 can be attached to the side wall face of the chip 120, and the third segment 133 can be attached to the upper surface of the chip 120 (the "up" direction as illustrated in FIG. 1). The extension direction of the first segment 131 may be the same as the extension direction of the third segment 133, and the extension direction of the second segment 132 may be perpendicular to the extension direction of the first segment 131.

For the chip assembly 100 for the camera 10 according to the embodiments of the present disclosure, by attaching a part of the conductive wire 130 to the side wall face of the chip 120, the fixation of the conductive wire 130 can be facilitated, and the installation stability of the conductive wire 130 can be improved, thereby avoiding the situation that the conductive wire 130 is broken due to various reasons such as post-baking stress, process control, and reliability experiments. In addition, the length of the conductive wire 130 can also be shortened to prevent the conductive wire 130 from forming an arc shape and increasing the thickness of the chip assembly 100, to reduce the design size of the chip assembly 100 and facilitate the miniaturization design of the camera 10.

In the description of the present disclosure, it should be understood that, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present disclosure, "a plurality of" means two or more than two, unless specified otherwise.

In the description of the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Reference throughout this specification to "an embodiment," "some embodiments," "an example", "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Moreover, the particular features, structures, materials, or characteristics described may be combined in any suitable manner in one or more embodiments or examples. Moreover, in a case of no contradiction, those skilled in the art may incorporate and combine different embodiments or examples and features of the different embodiments or examples described in this specification.

Although embodiments of the present disclosure have been illustrated and described above, it could be understood by those skilled in the art that, the above embodiments are examples and cannot be construed to limit the present disclosure, and changes, modifications, alternatives, and variations can be made in the embodiments without departing from the scope of the present disclosure.

What is claimed is:

1. A chip assembly for a camera, comprising:
   a circuit board;
   a chip provided to the circuit board and stacked with the circuit board; and
   a conductive wire having a first end electrically coupled to the circuit board and a second end electrically coupled to the chip, a partial segment of the conductive wire attached to a side wall face of the chip,
   wherein the circuit board is provided with a first welding point, and the chip is provided with a second welding point,
   wherein the second welding point is located in a position on the chip close to the first welding point, and the first welding point is located in a position on the circuit board close to the second welding point, and
   wherein the conductive wire has the first end electrically coupled with the first welding point and the second end electrically coupled with the second welding point.

2. The chip assembly according to claim 1, wherein the side wall face of the chip has a groove, and the conductive wire is embedded in the groove.

3. The chip assembly according to claim 2, wherein the groove is configured as a semi-cylindrical groove.

4. The chip assembly according to claim 3, wherein an axis direction of the semi-cylindrical groove is colinear with a thickness direction of the chip.

5. The chip assembly according to claim 1, wherein the conductive wire is an injection-molded part, and the conductive wire is formed on the side wall face of the chip.

6. The chip assembly according to claim 1, wherein the conductive wire is a printed circuit.

7. The chip assembly according to claim 1, wherein the conductive wire is a gold wire.

8. The chip assembly to claim 1, wherein the conductive wire comprises:
   a first segment attached to an upper surface of the circuit board; and
   a second segment having a lower end coupled with the first segment, the second segment attached to the side wall face of the chip.

9. The chip assembly to claim 8, wherein the first segment is perpendicular to the second segment.

10. The chip assembly according to claim 8, wherein the conductive wire further comprises:
    a third segment coupled with an upper end of the second segment and attached to an upper surface the chip.

11. The chip assembly according to claim 10, wherein the third segment is perpendicular to the second segment.

12. The chip assembly according to claim 11, wherein the third segment is parallel with the first segment.

13. The chip assembly according to claim 1, wherein the circuit board has a rectangular shape, the chip has a rectangular ship, and the chip is located at middle potion of the circuit board.

14. The chip assembly according to claim 1, wherein the chip has a surface area smaller than a surface area of the circuit board, and the chip has an edge spaced from an edge of the circuit board.

15. A camera, comprising:
a circuit board having an upper surface;
a chip having a lower surface and a side wall face coupled to the lower surface, the lower surface of the chip is attached to the upper surface of the circuit board; and
a conductive wire having a first end electrically coupled to the circuit board and a second end electrically coupled to the chip, a partial segment of the conductive wire attached to the side wall face of the chip,
wherein the circuit board is provided with a first welding point, and the chip is provided with a second welding point,
wherein the second welding point is located in a position on the chip close to the first welding point, and the first welding point is located in a position on the circuit board close to the second welding point, and
wherein the conductive wire has the first end electrically coupled with the first welding point and the second end electrically coupled with the second welding point.

16. An electronic device, comprising:
a camera comprising:
a circuit board;
a chip provided to the circuit board and stacked with the circuit board; and
a conductive wire having a first end electrically coupled to the circuit board and a second end electrically coupled to the chip, a partial segment of the conductive wire attached to a side wall face of the chip; and
a housing, the camera being embedded in the housing,
wherein the circuit board is provided with a first welding point, and the chip is provided with a second welding point,
wherein the second welding point is located in a position on the chip close to the first welding point, and the first welding point is located in a position on the circuit board close to the second welding point, and
wherein the conductive wire has the first end electrically coupled with the first welding point and the second end electrically coupled with the second welding point.

17. The electronic device according to claim 16, wherein a plurality of cameras is provided.

18. The electronic device according to claim 17, wherein the plurality of cameras is electrically coupled.

19. The electronic device according to claim 16, further comprising a flash close to the camera.

* * * * *